(12) United States Patent
Supinski et al.

(10) Patent No.: US 6,256,208 B1
(45) Date of Patent: Jul. 3, 2001

(54) ADAPTABLE EXPANSION CARD WITH A MULTI-POSITION DAUGHTER CARD AND METHOD THEREFORE

(75) Inventors: Mark B. Supinski, Keswick; Henry Quan, Woodbridge, both of (CA)

(73) Assignee: ATI Technologies, Inc., Christchurch (BB)

( * ) Notice: Subject to any disclaimer, the term of this patent is extended or adjusted under 35 U.S.C. 154(b) by 0 days.

(21) Appl. No.: 09/167,825

(22) Filed: Oct. 7, 1998

(51) Int. Cl.[7] ....................................................... H05K 1/11
(52) U.S. Cl. .......................... 361/784; 361/759; 361/785; 361/790; 361/803; 439/74
(58) Field of Search .................................... 361/686, 753, 361/759, 784, 785, 789, 790, 791, 803; 439/55, 62, 74, 78

(56) References Cited

U.S. PATENT DOCUMENTS

| | | | |
|---|---|---|---|
| 4,674,812 | * | 6/1987 | Thom et al. ............................. 439/74 |
| 4,686,607 | * | 8/1987 | Johnson ................................. 361/785 |
| 5,099,394 | * | 3/1992 | Hood et al. ............................ 361/785 |
| 5,610,801 | * | 3/1997 | Begis ..................................... 361/784 |
| 5,611,057 | * | 3/1997 | Pecone et al. .................... 361/784 X |
| 5,628,637 | * | 5/1997 | Pecone et al. ........................... 439/74 |
| 5,754,796 | * | 5/1998 | Wang et al. ......................... 439/74 X |

* cited by examiner

Primary Examiner—Jayprakash N. Gandhi
(74) Attorney, Agent, or Firm—Vedder, Price, Kaufman & Kammholz

(57) ABSTRACT

An expansion card for a computer and a method for configuring the expansion card, where the expansion card includes a main card body, a daughter card, and a bracket. The main card body includes a coupling portion for coupling the expansion card to an expansion slot of the computer. The main card body further includes a connector area that is accessible from both the first and second face of the expansion card. The daughter card is coupled to the main card body on either he first or second face of the main card body, wherein the coupling configuration is determined based on the computer system chassis in which the expansion card is to be mounted The daughter card includes a connector that couples to the connector area of the main card body. The bracket is coupled to the main card body and the daughter card and facilitates mounting the expansion card in the computer chassis. The bracket configuration is determined based on whether the daughter card is coupled to the first face or the second face of the main card body. In a first configuration, the expansion card is compatible with an ATX format chassis, and in a second configuration, the expansion card is compatible with an NLX format chassis.

19 Claims, 7 Drawing Sheets

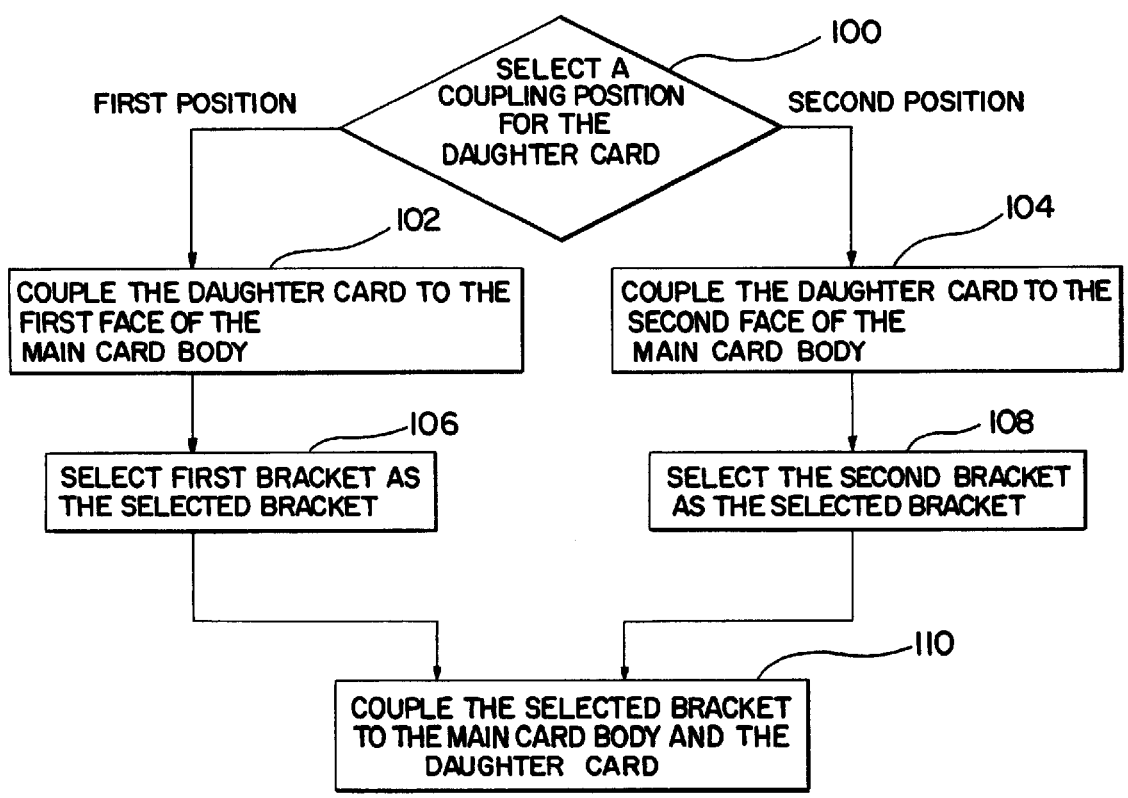

ADAPTABLE EXPANSION CARD WITH A MULTI-POSITION DAUGHTER CARD AND METHOD THEREFORE

FIELD OF THE INVENTION

The invention relates generally to computer expansion cards and more specifically to an adaptable expansion card and method therefore.

BACKGROUND OF THE INVENTION

Computers are used for many purposes. In order to increase their potential capabilities, computers are often equipped with expansion slots. Expansion slots allow expansion cards to be inserted into the computer such that the circuitry of the cards becomes part of the overall computer system. Expansion cards can add such things as more memory, specialized interfaces for the control or monitoring of external equipment, circuitry for improved sound, circuitry for data communications, and many other capabilities that can be desirous in various applications. In order to add an expansion card to a system, the card is typically inserted into an expansion slot and then mounted to the chassis of the computer with a mounting bracket. The mounting bracket typically couples to the rear of the computer chassis, and may include apertures for allowing connections to the expansion card from external to the chassis.

As technology continues to evolve, computers progress to new and different designs. One of the challenges of producing expansion cards is making them compatible with as many different computer designs as possible. Computer manufacturers often standardize certain aspects of the expansion slots such that interoperability of expansion cards is encouraged. For example, the connectivity of the expansion slots can be standardized in terms of the number of pins and the ordering of the pins. The maximum physical dimensions and power consumption of the expansion cards are also often standardized.

A particular problem is presented when the standard maximum size of an expansion card is reduced. When the size of a computer chassis is reduced in terms of height, the maximum height of expansion cards is also reduced. Thus, older cards designed for the larger chassis are not compatible with the reduced-height systems. However, if the expansion slots in the reduced-height systems retain the other physical dimensions and electrical characteristics of the older chassis, shorter cards designed for the reduced-height systems can be used in those with the older, larger chassis design The ATX and NLX motherboard form-factor specifications describe the mechanical and electrical specifications for building a motherboard and the design considerations for developing a chassis to house the motherboard. The ATX form-factor is older and has larger dimensions. The NLX form-factor is the more recently introduced of the two and is designed for reduced-height expansion cards. Many ATX form-factor machines continue to be used and built, and it is desirable for NLX form-factor expansion cards to be functional in older ATX systems.

In some cases, the base, or main body portion of the expansion card does not provide enough circuit board area to house all of the circuitry that a user might like to have on an expansion card. In other cases, analog circuitry such as TV tuners may be desired on the expansion card. Circuitry of this type is often sensitive to the large amount of noise that can be injected into power and ground sources by digital circuits that are present on the expansion card. In addition to this, multiple connectors on the expansion card may be desirable such that interaction with multiple external circuits and systems is possible.

Consequently, a need exists for an expansion card that promotes interoperabihty with different chassis designs, allows for expansion of the circuit board area of the base portion of the card, has the ability to isolate noise-sensitive components, and supports multiple connectors in a cost-efficient, effective manner.

BRIEF DESCRIPTION OF THE DRAWINGS

FIG. 15 illustrates a flow chart of a method for configuring an expansion card in accordance with the present invention.

DETAILED DESCRIPTION OF A PREFERRED EMBODIMENT OF THE INVENTION

Generally, the present invention provides for an expansion card for a computer and a method for configuring the expansion card. The expansion card includes a main card body, a daughter card, and a bracket. The main card body includes a coupling portion for coupling the expansion card to an expansion slot of the computer. The main card body further includes a connector area that is accessible from both the first and second face of the expansion card. The daughter card is coupled to the main card body on either the first or second face of the main card body, wherein the coupling configuration is determined based on the computer system chassis in which the expansion card is to be mounted. The daughter card includes a connector that couples to the connector area of the main card body. The bracket is coupled to the main card body and the daughter card and facilitates mounting the expansion card within the computer chassis. The bracket configuration is determined based on whether the daughter card is coupled to the first face or the second face of the main card body. In a first configuration, the expansion card is compatible with an ATX format chassis, and in a second configuration, the expansion card is compatible with an NLX format chassis. By selecting the bracket and coupling the daughter card to the main card body based on the computer chassis in which the expansion card is to be used, a single card design can be used to satisfy the requirements of differing computer expansion card formats. This interoperability reduces manufacturing and design costs, and allows a smaller inventory of expansion cards to be maintained while still satisfying the needs of a diverse customer base.

The invention can be better understood with reference to FIGS. 1–15. FIGS. 1–7 illustrate perspective views of the expansion card and accompanying bracket configured in a first format, which is preferably compatible with an ATX chassis. FIGS. 8–14 illustrate perspective views of the expansion card and accompanying bracket configured in a second format, which is preferably compatible with an NLX chassis. FIG. 15 illustrates a method for configuring the expansion card as shown in FIGS. 1–14

Figure 1:
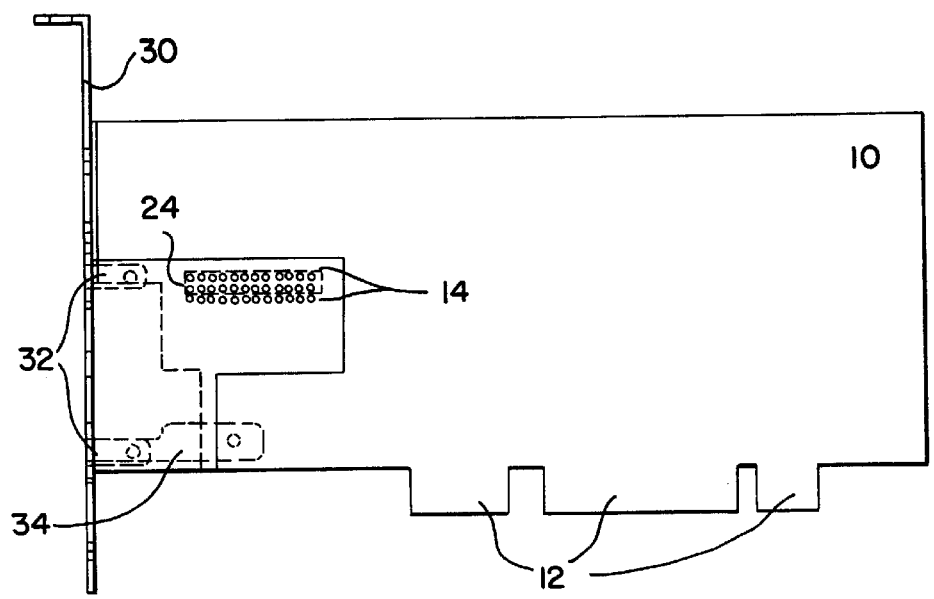
FIG. 1 illustrates a first view of an expansion card coupled to an ATX-compatible bracket in accordance with the present invention.

FIG. 1 illustrates a side view of the expansion card including the main card body 10, daughter card 20, and bracket 30. The main card body 10 has a top side, a bottom side, a front side, a rear side, a first face and a second face. Preferably, the dimensions of the main card body 10 are within the size limitations of the NLX expansion card format. In FIG. 1, the main card body 10 is depicted such that the first face of the main card body 10 is visible. The main card body 10 includes a coupling portion 12 for coupling the expansion card to an expansion slot of the computer. Preferably, the coupling portion 12 is compatible with both ATX and NLX expansion slots, the format for which is known in the art. The main card body 10 also includes a connector area 14 which is adapted to allow the daughter card 20 to couple to the main card body 10 when it is mounted to either the first face or the second face. Preferably, the connector area 14 allows electrical signals to be transmitted between the daughter card 20 and the main card body 10. Preferably, the connector area 14 includes a plurality of pin sockets that extend through the main card body 10 such that they pin sockets are accessible from both the first and second face of the main card body 10.

Figure 8:
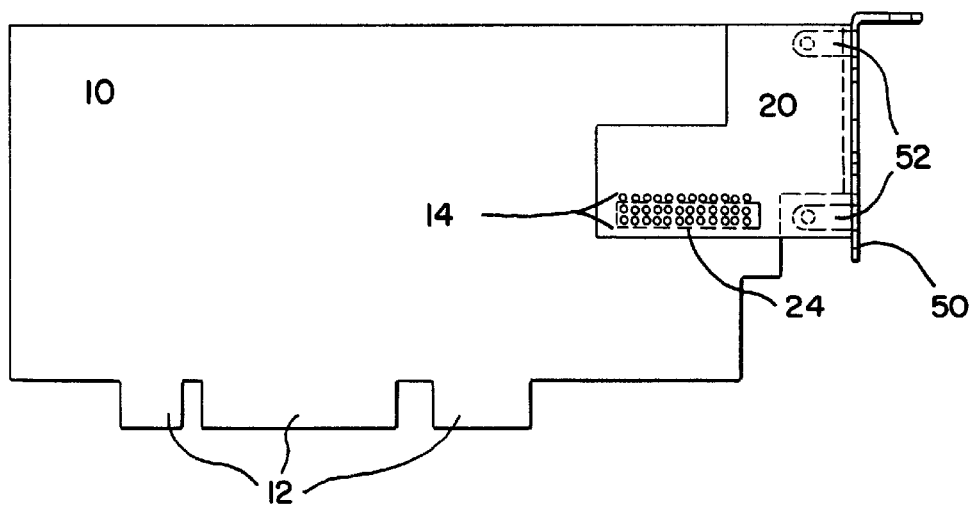
FIG. 8 illustrates a first view of an expansion card coupled to an NLX-compatible bracket in accordance with the present invention.

In one embodiment, the connector area 14 includes a plurality of connector rows. The plurality of connector rows includes a central row and at least one row pair where the row pair includes one row on each side of the central row. When the daughter card 20 is coupled to the main card body 10 on the first face, as is illustrated in FIG. 1, the central row and the top row of the row pair are used for coupling. When the daughter card 20 is coupled to the main card body 10 on the second face, as is illustrated in FIG. 8, the central row and the bottom row of the row pair are used for coupling. It should be apparent that if additional connections are required, additional row pairs may be added to the connector area 14. Similarly, numerous connector areas may be included on the main card body 10 to facilitate physical and electrical coupling of the main card body 10 and the daughter card 20.

In another embodiment, the connector area 14 of the main card body 10 includes a smaller number of connector rows, and the connector 24 of the daughter card 20 includes a larger number of connector rows. In this embodiment, a subset of the connector rows of the connector 24 are used to couple the daughter card 20 to the main card body 10. The coupling position of the daughter card 20 to the main card body 10 determines which of the rows within the connector 24 are matched with rows on the connector area 14. For example, in a similar embodiment to that illustrated in the Figures, the connector area 14 of the main card body 10 includes two connector rows and the connector 24 of the daughter card 20 includes three connector rows. Two of the three rows on the daughter card 20 couple to the two rows on the main card body 10, and which two of the three rows is dependent on the position of the daughter card 10 on either the first or second face of the main card body 10.

The daughter card 20 has a first side, a second side opposite the first side, a front side, a rear side, a front face and a rear face. The daughter card 20 further includes a connector 24 extending outward from the rear face of the daughter card 20. The connector 24 is adapted to operably couple to the connector area 14 of the main card body 10. When the daughter card 20 is coupled to the main card body 10, the connector 24 extends across a gap that is formed between the daughter card 20 and the main card body 10. The daughter card 20 is adapted to couple to the main card body 10 in at least two positions. In the first position, which is illustrated in FIG. 1, the daughter card 20 is coupled to the first face of the main card body 10 proximal to the bottom-rear corner of the main card body 10. In the first position, the rear side of the daughter card 20 is generally aligned with the rear side of the main card body 10 to form a rear side of the expansion card In the first position, the first side of the daughter card 20 is proximally aligned with the bottom side of the main card body 10.

Figure 4:
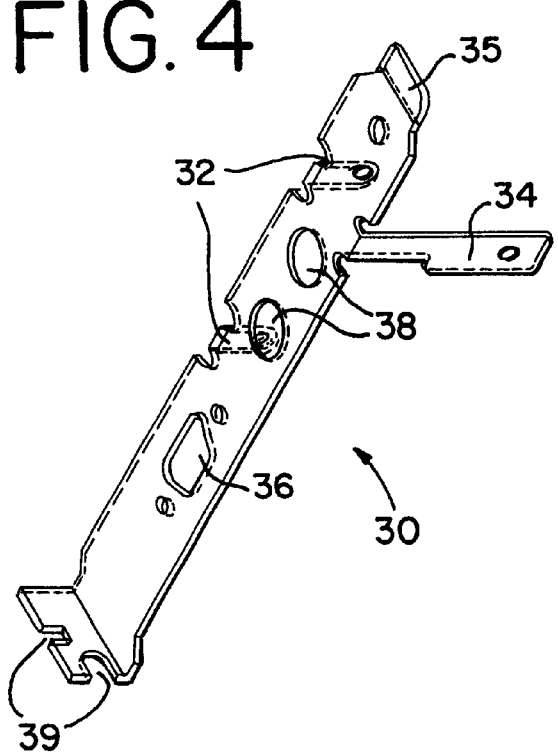
FIG. 4 illustrates a perspective view of an ATX-compatible bracket in accordance with the present invention.
Figure 5:
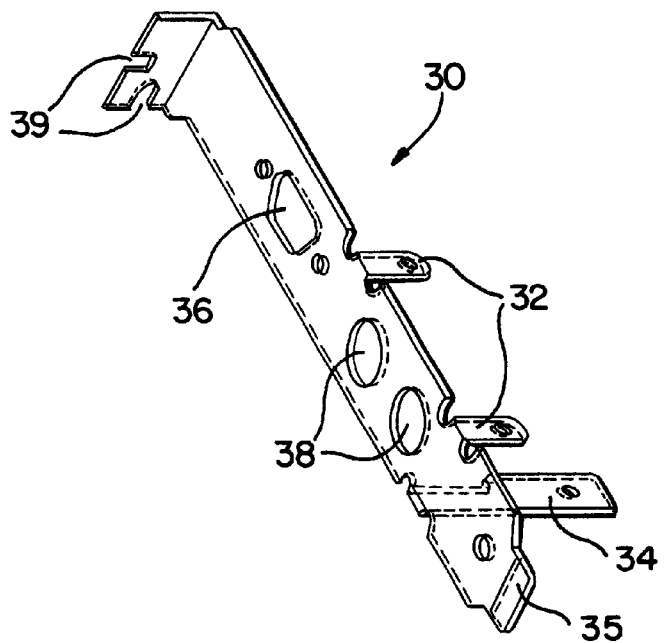
FIG. 5 illustrates another perspective view of an ATX-compatible bracket in accordance with the present invention.

Preferably, coupling the daughter card 20 to the main card body 10 in the first position results in an expansion card that is compatible with an ATX system. A bracket 30 is coupled to the rear side of the expansion card in such a format. The bracket 30 is adapted to couple the expansion card to the computer chassis. FIGS. 4 and 5 illustrate isolated perspective views of the bracket 30.

Figure 3:
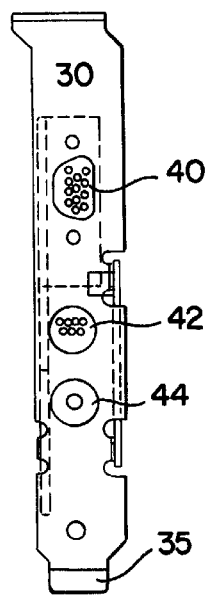
FIG. 3 illustrates a third view of an expansion card coupled an ATX-compatible bracket in accordance with the present invention.

The main card body 10 may include one or more external connector ports 40 coupled to the first face main card body 10 proximate to the rear side of the expansion card and the top side of the main card body 10. Although not depicted in FIG. 1, the connector port 40 is shown in FIG. 3 as viewed through aperture 36 of the bracket 30. The external connector port 40 allows the expansion card to be coupled to circuitry external to the computer chassis.

Similarly, the daughter card 20 may include one or more external connector ports 42, 44 coupled to the rear face of the daughter card proximate to the rear side of the expansion card. These connector ports are also illustrated in FIG. 3 as visible through apertures 38 of the bracket 30. In some embodiments, the external connector ports of the daughter card 20 may extend away from the daughter card a greater distance than the width of the gap between the daughter card 20 and the main card body 10. In such embodiments, a recessed portion is included in the main card body 10 to allow the external connector ports 42, 44 to extend past the main card body 10. The width specifications for ATX expansion cards is more limiting than that for NLX cards, and therefore this problem does not arise when the card is placed in the second position. In the second position, which is illustrated in FIG. 8, the gap is merely widened to accommodate the external connector ports 42, 44.

When the daughter card 20 is coupled to the main card body 10 in the first position, the external connector port 40 of the main card body 10 and the external connector ports 42, 44 of the daughter card are generally aligned vertically along the rear side of the expansion card. The bracket 30 extends lengthwise at least the length of the expansion card and has a width that is proximate to the width of the expansion card, which in turn is proximate to the width of the gap between the main card body 10 and the daughter card 20. This is best illustrated by the perspective view provided in FIG. 2.

As is illustrated in FIGS. 3, 4, and 5, the bracket 30 includes apertures 36 and 38 to allow the external connector ports 40, 42, and 44 to be accessed from external to the computer chassis when the expansion is mounted in the computer. The bracket 30 further includes tab 35 which is inserted in the motherboard or mounting slot of the computer chassis. The bracket 30 also includes tabs 32 for coupling to the daughter card 20. These tabs are adapted to allow for a solid physical connection between the bracket 30 and the daughter card 20. Preferably, screw holes, which may be tapped, are included on the tabs 32 and the bracket 30 is mounted to the daughter card 20 with screws. Similarly, mounting arm 34 of the bracket 30 allows the bracket to couple to the main card body 10 with a screw or other fastener. The mounting arm 34 extends further from the main planar surface of the bracket 30 in order to extend across the recessed portion of the main card body 10 and also to provide additional support to the bracket. The bracket 30 also includes coupling notches 39 that allow the bracket to mount to the slots of the computer chassis provided for expansion cards.

Figure 6:
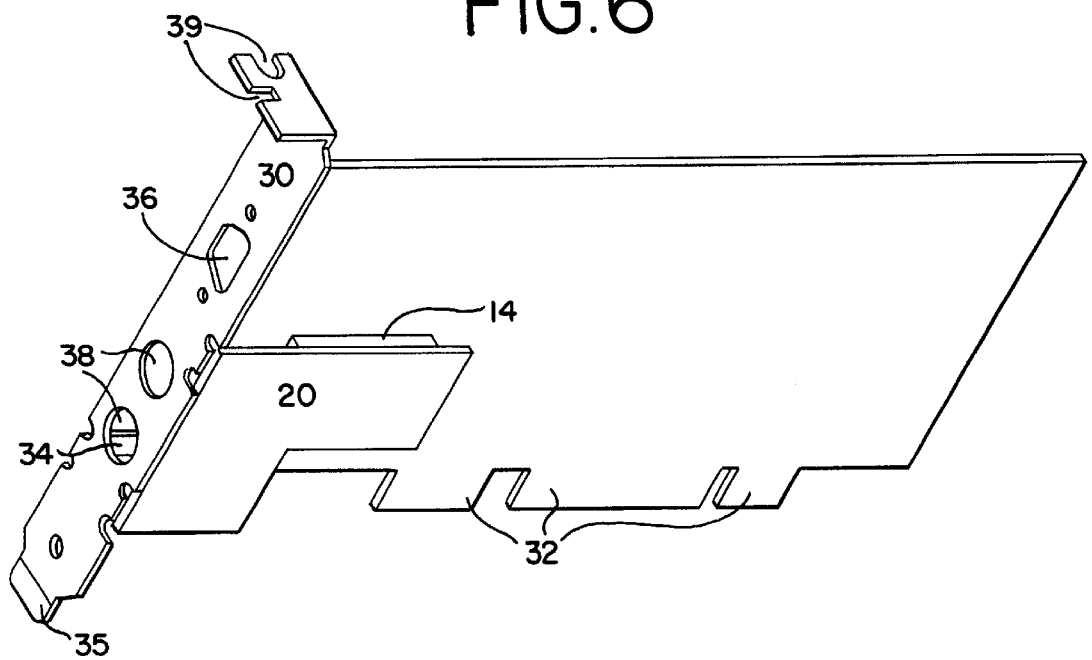
FIG. 6 illustrates a perspective view of the coupling arrangement of a main card body, a daughter card, and an ATX-compatible bracket in accordance with the present invention.
Figure 7:
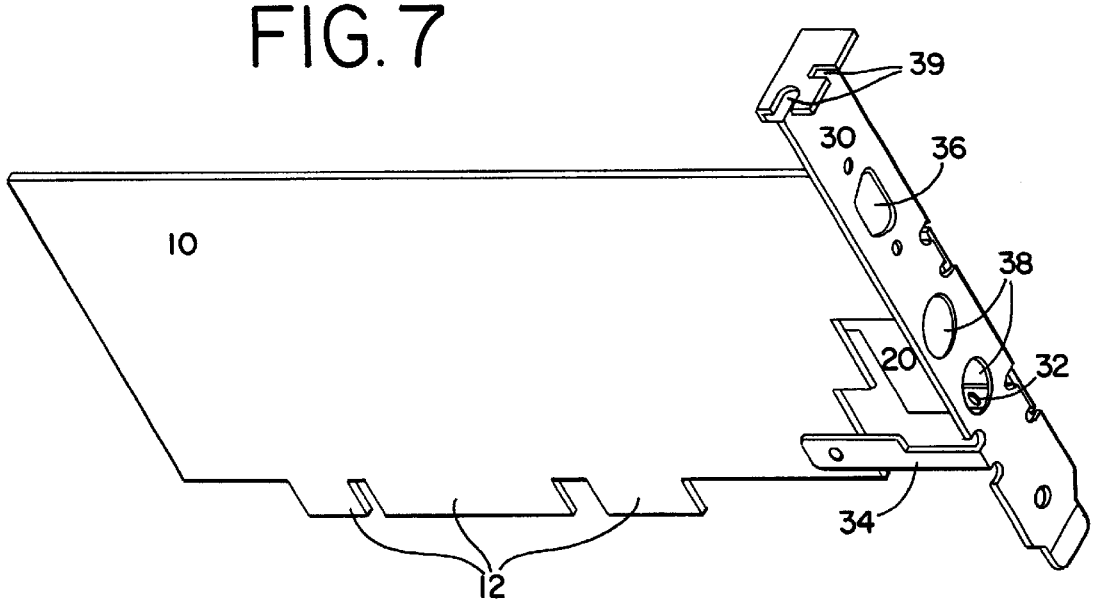
FIG. 7 illustrates another perspective view of the coupling arrangement of a main card body, a daughter card, and an ATX-compatible bracket in accordance with the present invention.

Thus, in the ATX format configuration, the external connector ports 40, 42, and 44 are aligned vertically along the rear side of the expansion card, and the bracket 30 includes a vertically-aligned set of apertures to allow access to the ports. The external connector ports 42, 44 of the daughter card 20 are positioned proximal to the same face of the main card body 10 as the external connector port 40 of the main card body 10. FIGS. 6 and 7 are provided for additional insight into the spatial relationships between the daughter card 20, the main card body 10, and the bracket 30. Note that a great deal of detail in terms of circuitry and connectors has been omitted in order to simplify the drawings and further the illustration of the spatial relationships among the components.

Figure 9:
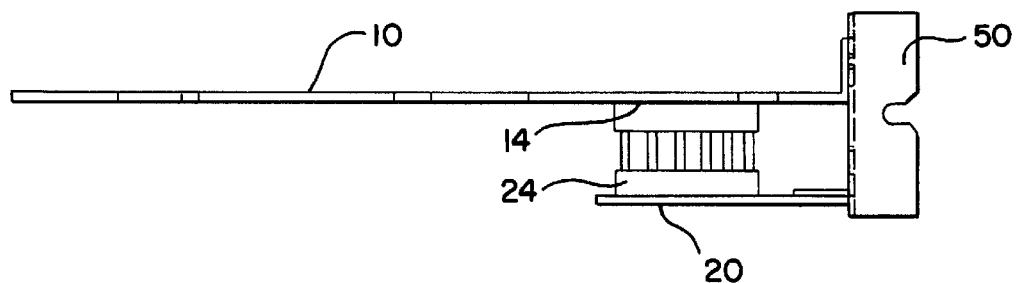
FIG. 9 illustrates a second view of an expansion card coupled to an NLX-compatible bracket in accordance with the present invention.
Figure 10:
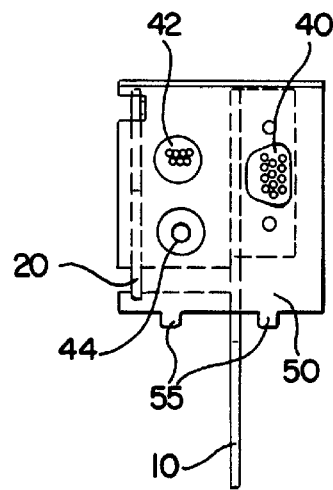
FIG. 10 illustrates a third view of an expansion card coupled to an NLX-compatible bracket in accordance with the present invention.

FIGS. 8–10 illustrate the expansion card with the daughter card 20 in the second position. In the second position, the daughter card 20 is coupled to the second face of the main card body 10. Note that, as illustrated in the Figures, the rear side of the expansion card was to the left in FIG. 1, and in FIG. 8, the rear side of the card is to the right. The second face of the main card body 10 is visible in FIG. 8. When the daughter card 20 is coupled to the main card body 10 in the second position, the rear side of the daughter card 20 is generally aligned with the rear side of the main card body 10 to form the rear side of the expansion card. In the second position, first side of the daughter card 20 is proximally aligned with the top side of the main card body.

Figure 11:
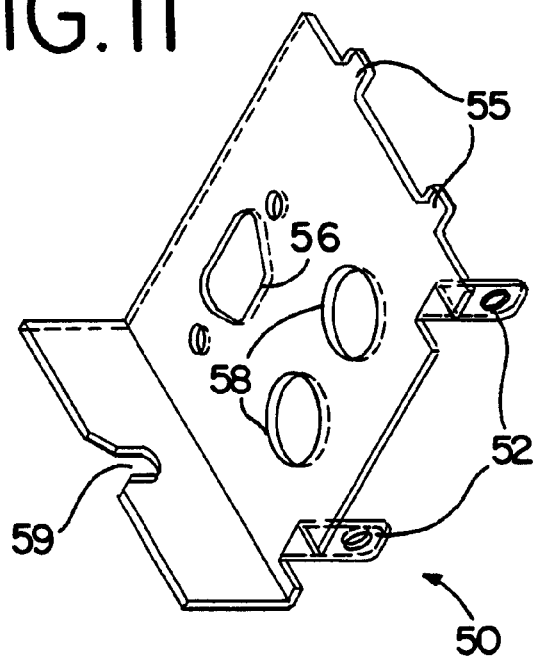
FIG. 11 illustrates a perspective view of an NLX-compatible bracket in accordance with the present invention.
Figure 12:
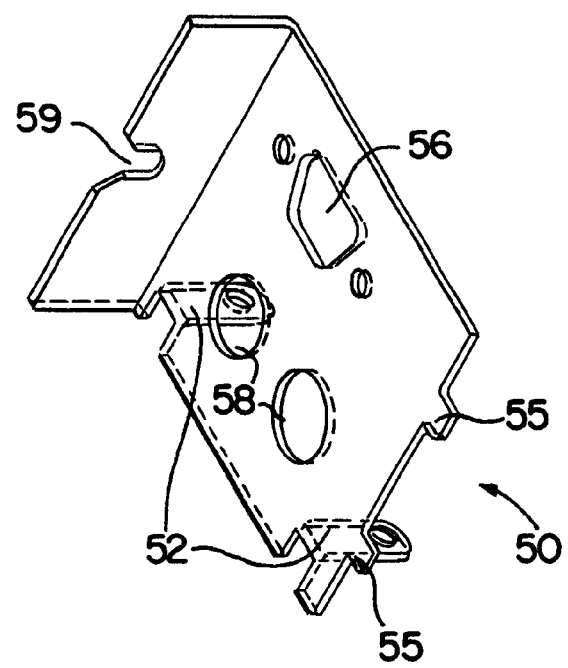
FIG. 12 illustrates another perspective view of an NLX-compatible bracket in accordance with the present invention.

As stated above, the connector 24 of the daughter card 20 couples to the central row and the bottom row of the connector area 14. It should be noted that, as stated earlier, the main card body 10 may have the smaller number of rows such that specific connector rows on the daughter card 20 are selected for the coupling. Coupling the daughter card 20 to the second face of the main card body 10 places the external connector ports 42, 44 on the opposite side of the main card body 10 in relation to the external connector port 40. This is best illustrated in FIG. 10. The physical configuration of the expansion card slots in the chassis of an NLX system is different from that of an ATX system, and a different bracket is required to mount an expansion card into each type of system. An NLX bracket is shorter and wider than an ATX bracket. FIGS. 4 and 5 illustrate the ATX-type bracket that allows the expansion card configured with the daughter card 20 in the first position to be mounted in an ATX system, whereas FIGS. 11 and 12 illustrate an NLX-type bracket that allows the expansion card configured with the daughter card 20 in the second position to be mounted in an NLX system.

Figure 13:
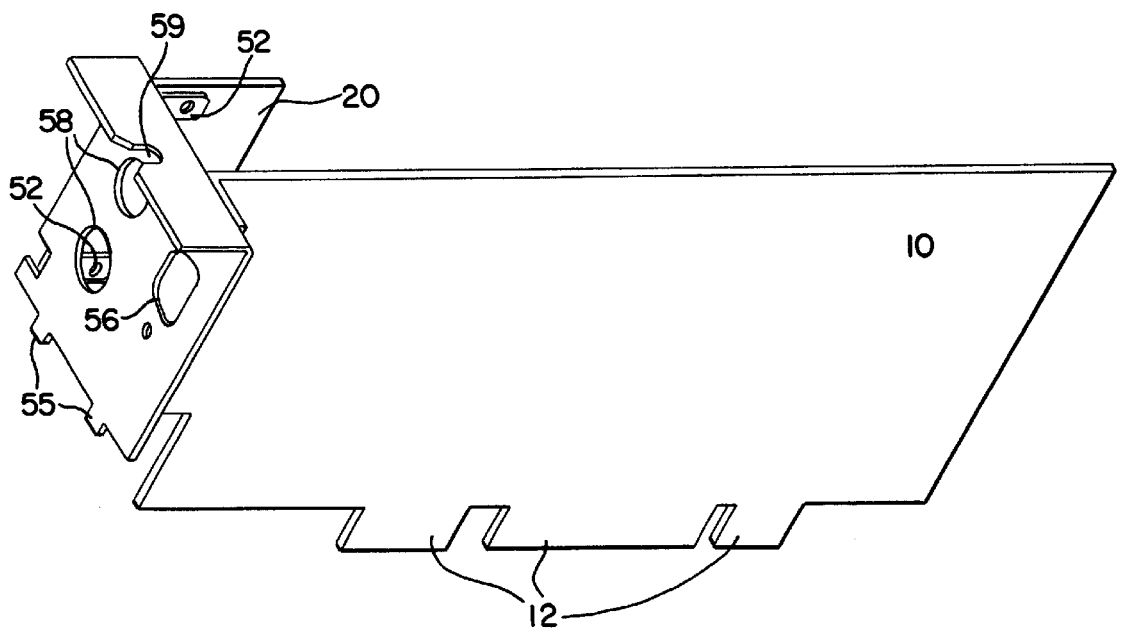
FIG. 13 illustrates a perspective view of the coupling arrangement of a main card body, a daughter card, and an NLX-compatible bracket in accordance with the present invention.
Figure 14:
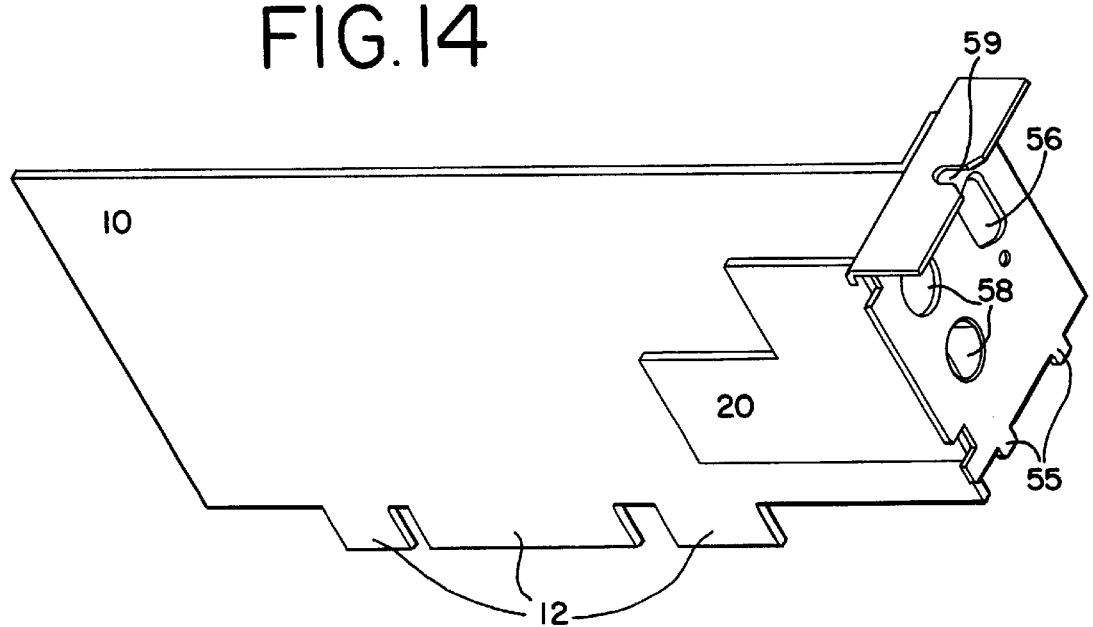
FIG. 14 illustrates another perspective view of the coupling arrangement of a main card body, a daughter card, and an NLX-compatible bracket in accordance with the present invention.

The bracket 50 of FIGS. 8–14 is an NLX format bracket that includes tabs 55 for mounting to the motherboard or the chassis of the computer. The bracket 50 also includes mounting tabs 52 for mounting to the bracket mounts of the daughter card 20. The coupling of the mounting tabs 52 to the daughter card 20 is best illustrated in FIGS. 13 and 14. Although FIGS. 13 and 14 omit some detail in terms of ports and circuitry, they provide a good indication of the spatial positioning of the bracket 50, the main card body 10, and the daughter card 20 in the second position. Mounting aperture 59 allows the bracket 50 to be secured to the chassis of the computer opposite the tabs 55. Apertures 58 are included in the bracket 50 to allow the external connector ports 42, 44 of the daughter card 20 to be accessed from external to the computer chassis. Similarly, the bracket 50 includes an aperture 56 to allow the external connector port 40 of the main card body 10 to be accessed from external to the computer chassis.

When the daughter card 20 is in the second position, the bracket 50 is coupled to the daughter card 20 and the main card body 10 to allow the expansion card to be properly mounted in the computer chassis. In such a configuration, the bracket extends from the top side of the main card body 10 to a point along the rear side of the expansion card proximal to the second side of the daughter card. Preferably, the width of the bracket 50 is proximate in size to twice the gap between the daughter card 20 and the main card body 10. Note that the width of the gap may be adapted to suit specific board applications, and in such cases, the width of the bracket 50 may not approximate twice the width of the gap.

The main card body 10 intersects the bracket 50 along a central line that divides the bracket 50 approximately in half to form a first bracket half and a second bracket half The apertures 58 for the external connector ports 42, 44 of the daughter card 20 are located in the second bracket half, and the aperture 56 for the external connector port 40 of the main card body 10 is located in the first bracket half. Note that more or fewer external connector ports may be provided in the space available on the main card body 10 and the daughter card 20, and matching apertures provided in the bracket 50.

One of the advantages of the present invention is that it allows for additional connectors to be added to a main card body 10 through the use of a daughter card 20. Because the slots in the chassis of an ATX and NLX system are different, different brackets with different aperture placements are required. By allowing the daughter card 20 to be coupled to either face of the main card body 10, connector ports on the daughter card 20 can be shifted to allow the ports to be accessed in either an ATX system or an NLX system.

In addition to this, the daughter card 20 may be designed to add additional area for expansion card circuitry if the main card body 10 does not provide enough board area. The daughter card 20 may not include any external connection ports, but may instead simply provide additional circuit board space. In such a case, the size of the daughter card 20 may be much greater than that illustrated in the Figures. Additional mounting mechanisms may be required on the daughter card 20 and the main card body 10 to ensure that the coupling between the two is secure.

Because the daughter card 20 and the main card body 10 are implemented on different printed circuit boards, some electrical isolation advantages may also be achieved by implementing certain circuitry on one card or the other. Some circuits generate a great deal of ringing on the power and ground nodes, and this ringing or noise can have detrimental effects on other circuits of the system. Separating these two portions through the use of the daughter card 20 may improve the performance of the expansion card.

Figure 2:
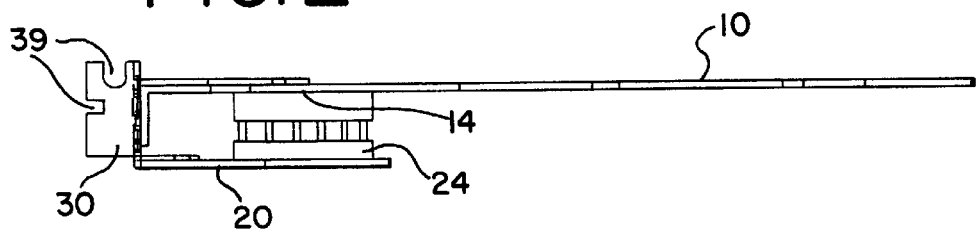
FIG. 2 illustrates a second view of an expansion card coupled to an ATX-compatible bracket in accordance with the present invention.

FIG. 15 illustrates a method for configuring an expansion card, where the expansion card is preferably of the type shown in FIGS. 1–14. At step 100, a coupling position is selected for the daughter card with respect to the main card body. When the daughter card is positioned in the first position, the expansion card is compatible with a first format computer chassis. Similarly, when the daughter card is positioned in the second position, the expansion card is compatible with a second format computer chassis. The main card body and daughter card of the method illustrated are of the same configuration as those illustrated with respect to FIGS. 1–14. The first position reflects the position of the daughter card as shown in FIGS. 1–3, and the second position reflects the position of the daughter card as shown in FIGS. 8–10.

If the first coupling position is selected, the method proceeds to step 102, where the daughter card is coupled to the first face of the main card body. This is the configuration illustrated by FIGS. 1–3. At step 106, an appropriate bracket is selected to couple to this configuration of the daughter card and the main card body. The bracket is selected to allow the expansion card to be coupled to the first format computer chassis and is of the type illustrated in FIGS. 1–7.

If the second coupling position is selected at step 100, the method proceeds to step 104, where the daughter card is coupled to the second face of the main card body. This is the configuration illustrated by FIGS. 8–10. At step 108, an appropriate bracket is selected to couple to this configuration of the daughter card and the main card body. The bracket is selected to allow the expansion card to be coupled to the second format computer chassis and is of the type illustrated in FIGS. 8–14.

At step 110, the bracket is coupled to the main card body and the daughter card. The coupling of the bracket may be facilitated by the use of the screws or other coupling mechanisms as described earlier. Using the method of FIG. 15, a daughter card and main card body can be coupled in different ways to allow the resulting expansion card to be used with different computer chassis having different dimensional requirements. The appropriate bracket can then be attached to allow the card to be properly mounted in the chassis. By allowing for these varied configurations, a single design for the expansion card can be used to satisfy the needs of a variety of users. This eliminates multiple design efforts and allows the components to be configured based on the needs of the customers, reducing production costs and inventory requirements.

Similarly, the daughter card, main card body, and both of the brackets discussed above may be included by an expansion card manufacturer when the manufacturer packages the expansion card. The user can then determine the type of chassis in which the expansion card will be mounted, and couple the components in the appropriate manner to configure the expansion card By providing both brackets with the daughter card and the main card body, a single set of components will have the ability to function in either one of the two formats.

It should be understood that the implementation of other variations and modifications of the invention in its various aspects will be apparent to those of ordinary skill in the art, and that the invention is not limited by the specific embodiments described. For example, the physical configuration of the daughter card or the method through which it is electrical and physically coupled to the main card body can be altered to suit the particular needs of the expansion card. It is therefore contemplated to cover by the present invention, any and all modifications, variations, or equivalents that fall within the spirit and scope of the basic underlying principles disclosed and claimed herein.

What is claimed is:

1. An expansion card for a computer, the expansion card comprising:

a main card body having a top side, a bottom side, a front side, a rear side, a first face and a second face, wherein there is a coupling portion along the bottom side of the main card for coupling the expansion card to an expansion slot of the computer, and wherein the main card body further includes a connector area that is accessible from the first face and the second face;

a daughter card coupled to the main card body, wherein the daughter card is adapted to couple to the main card body in at least a first position and a second position, wherein the daughter card has a first side, a second side opposite the first side, a front side, a rear side opposite the front side, a front face, and a rear face, wherein the daughter card has a connector extending outward from the rear face of the daughter card, wherein the connector is adapted to operably couple to the connector area of the main card body, wherein when the daughter card is coupled to the main card body, the connector extends across a gap that is formed between the daughter card and the main card body, wherein when the daughter card is in the first position, the daughter card is coupled to the first face of the main card body, the rear side of the daughter card is generally aligned with the rear side of the main card body to form a rear side of the expansion card, and the first side of the daughter card is proximally aligned with the bottom side of the main card body, wherein when the daughter card is in the second position, the daughter card is coupled to the second face of the main card body, the rear side of the daughter card is generally aligned with the rear side of the main card body to form the rear side of the expansion card, and the first side of the daughter card is proximally aligned with the top side of the main card body.

2. The expansion card of claim 1, wherein the connector area of the main card body includes a plurality of connector rows, wherein the plurality of connector rows includes a central row and at least one row pair, wherein the row pair includes a first row on a first side of the central row and a second row on a second side of the central row, wherein when the daughter card is in the first position, the connector couples to the central row and the first row, and wherein when the daughter card is in the second position, the connector couples to the central row and the second row.

3. The expansion card of claim 2, wherein the connector rows are rows of pin sockets that extend through the main card body such that the pin sockets can be accessed from the first face or the second face of the main card body, and wherein the connector includes rows of pins that couple to the pin sockets by inserting the pins in the pin sockets.

4. The expansion card of claim 1, wherein the connector of the daughter card includes a plurality of connector rows, wherein the plurality of connector rows includes a central row and at least one row pair, wherein the row pair includes a first row on a first side of the central row and a second row on a second side of the central row, wherein when the daughter card is in the fist position, the connector area of the main card body couples to the central row and the first row, and wherein when the daughter card is in the second position, the connector area of the main card body couples to the central row and the second row.

5. The expansion card of claim 4, wherein the connector area of the main card body includes rows of pin sockets that extend through the main card body such that the pin sockets can be accessed from the first face or the second face of the main card body, and wherein the plurality of connector rows of the daughter card connector includes rows of pins that couple to the pin sockets by inserting the pins in the pin sockets.

6. The expansion card of claim 1, wherein the main card body includes a plurality of connector areas accessible from both the first face and the second face of the main card body, and wherein the daughter card includes a plurality of connectors adapted to couple to the plurality of connector areas.

7. The expansion card of claim 1, wherein the main card body is an NLX format card.

8. The expansion card of claim 1 further comprises at least one main card external connector port operably coupled to the first face of the main card body proximate to the rear side of the expansion card and the top side of the main card body.

9. The expansion card of claim 8 further comprises a bracket operably coupled to the rear side of the expansion card, wherein the bracket is adapted to couple the expansion card to a chassis of the computer, wherein the bracket includes at least one main connector aperture adapted to allow the at least one main card external connector port to be accessed from external to the chassis of the computer.

10. The expansion card of claim 9, wherein the expansion card further comprises at least one daughter card external connector port operably coupled to the rear face of the daughter card proximate to the rear side of the daughter card.

11. The expansion card of claim 10, wherein the main card body further includes a recessed portion along the rear side of the main card body, wherein the recessed portion allows the at least one daughter card external connector port to extend outward from the rear face of the daughter card a distance greater than the gap between the daughter card and the main card body.

12. The expansion card of claim 11, wherein the daughter card is in the first position and the bracket extends lengthwise at least the length of the rear side of the expansion card and has a width that is proximate in size to the gap between the daughter card and the main card body, wherein the bracket includes at least one daughter connector aperture adapted to allow the at least one daughter card external connector port to be accessed from external to the chassis of the computer, wherein the at least one main connector aperture and the at least one daughter connector aperture are generally aligned along the length of the bracket.

13. The expansion card of claim 12, wherein the bracket is compatible with an ATX chassis.

14. The expansion card of claim 11, wherein the daughter card is in the second position and the bracket extends from the top side of the main card body to a point along the rear side of the expansion card proximal to the second side of the daughter card, wherein width of the bracket is proximate in size to twice the gap between the daughter card and the main card body, and wherein the bracket is positioned such that the main card body intersects the bracket along a central line that divides the bracket approximately in half to form a first bracket half and a second bracket half, and wherein the bracket includes at least one daughter connector aperture adapted to allow the at least one daughter card external connector port to be accessed from external to the chassis of the computer, wherein the at least one main connector aperture is positioned in the first bracket half and the at least one daughter connector aperture is positioned in the second bracket half.

15. The expansion card of claim 14, wherein the bracket is compatible with an NLX chassis.

16. The expansion card of claim 10, wherein the daughter card further comprises at least one bracket mount positioned along the rear side of the daughter card, wherein the at least one bracket mount allows the daughter card to effectively couple to the selected bracket.

17. A method for configuring an expansion card, the method comprising:
connecting a daughter card to a main card body in one of a plurality of coupling positions,
wherein when the daughter card is coupled to the main card body in the first position, the expansion card is compatible with a first format computer chassis, and when the daughter card is coupled to a main card body in the second position, the expansion card is compatible with a second format computer chassis,
wherein the main card body has a top side, a bottom side, a front side, a rear side, a first face and a second face, wherein there is a coupling position along the bottom side of the main card for coupling the expansion card to an expansion slot of the computer, and wherein the main card body further includes a connector area that is accessible from the first face and the second face, wherein the main card body includes at least one main card external connector port operably coupled to the first face of the main card body proximate to the rear side of the expansion card and the top side of the main card body, and
wherein the daughter card has a first side, a second side opposite the first side, a front side, a rear side opposite the front side, a front face, and a rear face, wherein the daughter card has a connector extending outward from the rear face of the daughter card, wherein the connector is adapted to operably couple to the connector area of the main card body, wherein the connector extends across a gap that is formed between the daughter card and the main card body, and wherein the daughter card includes at least one daughter card external connector port operably coupled to the rear face of the daughter card proximate to the rear side of the daughter card;
when the first position is selected as the coupling position, coupling the daughter card to the first face of the main card body, wherein the rear side of the daughter card is generally aligned with the rear side of the main card body to form a rear side of the expansion card, and the first side of the daughter card is proximally aligned with the bottom side of the main card body; and when the second position is selected as the coupling position, coupling the daughter card to the second face of the main card body, wherein the rear side of the daughter card is generally aligned with the rear side of the main card body to form the rear side of the expansion card, and the first side of the daughter card is proximally aligned with the top side of the main card body.

18. The method of claim 17, wherein coupling the daughter card to the main card body further comprises coupling the connector of the daughter card to the connector area of the main card body.

19. The method of claim 18 further comprises:

selecting a bracket based on the coupling position of the daughter card, wherein when the coupling position is the first position:
the bracket is selected such that the bracket is adapted to couple the expansion card to the first format computer chassis, wherein the bracket extends lengthwise at least the length of the rear side of the expansion card and has a width that is proximate in size to the gap between the daughter card and the main card body, and the bracket includes apertures adapted to allow the at least one main card external connector port and the at least one daughter card external connector port to be accessed from external to the chassis of the computer, wherein the apertures are generally aligned along the length of the bracket; and wherein when the coupling position is the second position:
the bracket is selected such that the bracket is adapted to couple the expansion card to the second format computer chassis, wherein the bracket extends lengthwise from the top side of the main card body to a point along the rear side of the expansion card proximal to the second side of the daughter card, wherein width of the bracket is proximate in size to twice the gap between the daughter card and the main card body, and the bracket includes apertures adapted to allow the at least one main card external connector port and the at least one daughter card external connector port to be accessed from external to the chassis of the computer, wherein the apertures are generally aligned along the width of the bracket; and coupling the bracket to the expansion card.

* * * * *